United States Patent [19]

Ikeda et al.

[11] 4,098,712

[45] Jul. 4, 1978

[54] PROCESSING SOLUTION FOR METAL IMAGE-FORMING MATERIAL

[75] Inventors: Tomoaki Ikeda; Yasuo Washizawa; Masamiti Sigyo; Sadaharu Ikeda; Satoshi Yoshida, all of Asaka, Japan

[73] Assignee: Fuji Photo Film Co., Ltd., Minami-ashigara, Japan

[21] Appl. No.: 767,875

[22] Filed: Feb. 11, 1977

[30] Foreign Application Priority Data

Feb. 16, 1976 [JP] Japan .................................. 51-16304

[51] Int. Cl.$^2$ .............................................. C23F 1/02
[52] U.S. Cl. ...................... 252/79.5; 96/36; 96/48 R; 156/656; 156/659; 156/665
[58] Field of Search ............... 96/36, 36.1, 48 R, 63, 96/66 R, 66.3, 114.5; 156/665, 668, 659–661, 656; 427/336, 337; 252/79.1, 79.3, 79.4, 79.5

[56] References Cited

U.S. PATENT DOCUMENTS

| | | | |
|---|---|---|---|
| 3,793,035 | 2/1974 | Patel et al. | 96/36.1 |
| 3,944,421 | 3/1976 | Lewis et al. | 96/48 R |
| 3,957,553 | 5/1976 | Smith | 156/665 |
| 4,008,084 | 2/1977 | Ikeda et al. | 156/665 X |

*Primary Examiner*—William A. Powell

*Attorney, Agent, or Firm*—Sughrue, Rothwell, Mion, Zinn and Macpeak

[57] ABSTRACT

A processing solution useful for the development of or halftone dot reduction of a metal image-forming material comprising a support, a thin metallic layer composed mainly of aluminum on the support and a photosensitive resin layer on the metallic layer, with the processing solution comprising (1) an alkaline solution, such as an aqueous solution of sodium hydroxide or potassium hydroxide, and (2) at least one compound of the formula (I) or (II):

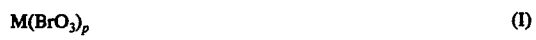

$$M(BrO_3)_p \qquad (I)$$

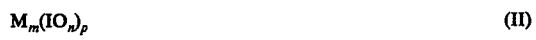

$$M_m(IO_n)_p \qquad (II)$$

wherein M represents a hydrogen atom or a metal having a valence of 1 to 3, $m$ represents 1, 2, 3, or 5, $n$ represents 3, 4, or 6, and $p$ represents 1, 2 or 3, which solution lends itself to safe storage and handling, and permits rapid and uniform etching of the metallic layer of the metal image-forming material without bubble formation occurring.

23 Claims, No Drawings

PROCESSING SOLUTION FOR METAL IMAGE-FORMING MATERIAL

BACKGROUND OF THE INVENTION

1. Field of the Invention

This invention relates to a processing solution for a metal image-forming material comprising a support, a thin metallic layer composed mainly of aluminum on the support, and a photosensitive resin (or a photoresist) layer on the thin metallic layer, and more specifically, to a developing solution used to develop the metal image-forming material and to a reducer solution used to reduce halftone dots (i.e., to reduce the size of the dot image) after development.

2. Description of the Prior Art

Japanese patent application (OPI) No. 139720/75 (corresponding to U.S. patent application Ser. No. 571,817, filed Apr. 25, 1975, now U.S. Pat. No. 4,008,084) discloses a metal image-forming material comprising a support, a thin metallic layer composed mainly of aluminum on the support, and a layer of a photosensitive resin on the metallic layer. When this metal image-forming material is exposed through an original image using actinic radiation and then brought into contact with an alkaline solution, the resin layer is dissolved or swollen at the exposed or unexposed portion depending on the property of the photosensitive resin layer. As a result, the alkaline solution contacts the metallic layer which is then dissolved to form the corresponding image. The pattern so obtained has high contrast and superior resolving power.

When this metal image-forming material is exposed through a halftone original and developed, substantially the same image as the original or an image whose light and dark areas have been substantially completely reversed from the original is obtained. This image can be used as an original to be printed on a printing plate. When it is desired to change the size of the halftone dots partially so as to obtain a better print, an operation termed "halftone dot reduction" is performed. Halftone dot reduction is well known and described in, for example, B. R. Halpern, *Color Correction for Offset Lithography*, section 20, pp. 32-35, (1956) and E. Jaffe, *Halftone Photography for Offset Lithography*, third Ed., Chapter XIII, pp. 140-147, (1964), both published by Graphic Arts Technical Foundation, Inc., New York. In dot reduction of a lithographic material containing silver halide which has heretofore been used to prepare a halftone original, the reducer solution acts on all of the surfaces of silver grains which form the image, and therefore, the optical density of each of the halftone dots as a whole decreases. In contrast, since in a metal image-forming material the resin layer is present on top of the metal layer which forms the images, the selection of a reducer solution which substantially cannot permeate through the resin layer makes it possible to cause the reducer solution to act on the halftone dots only at surfaces of such where the dots neither contact the photosensitive resin nor the support, and thus to change only the size of the area of the halftone dots.

However, when the developer solution disclosed in Japanese patent application (OPI) No. 139720/75 or the reducer solution used for the above purpose is merely an alkaline solution, vigorous foaming at the time of dissolving (etching) the metal occurs, and the resulting image is impaired. The foam generated adheres to the surface of the metal layer, and supply of the alkaline solution to these parts is hampered. This retards the etching of the metal. If the etching is prolonged until these parts are completely removed, those parts to which the alkaline solution has been supplied in a normal manner become excessively etched.

On the other hand, Japanese patent application (OPI) No. 2925/75 (corresponding to U.S. patent application Ser. No. 350,372, filed Apr. 12, 1973) discloses an etching solution obtained by adding sodium perchlorate to an alkaline solution, which is used for an image-forming material composed mainly of tellurium. As is well known, however, perchloric acid, chlorous acid, chloric acid, and the salts of these acids tend to undergo an explosive decomposition, and special care is required in their storage and handling. Some chlorate and perchlorate salts are designated even as first-grade dangerous articles under the Japanse Law of Fire Defense.

SUMMARY OF THE INVENTION

An object of this invention is to provide a processing solution suitable for the development of or halftone dot reduction of the above-described metal image-forming material.

Another object of this invention is to provide a processing solution which can be handled and stored safely.

The above objects are achieved by a processing solution useful for the development of or halftone dot reduction of a metal image-forming material comprising a support, a thin metallic layer composed mainly of aluminum on the support, and a photosensitive resin layer on the thin metallic layer, with the processing solution comprising (1) an alkaline solution containing (2) at least one compound of the formula (I) or (II):

$$M(BrO_3)_p \qquad (I)$$

$$M_m(IO_n)_p \qquad (II)$$

wherein M represents a hydrogen atom or a metal having a valence of 1 to 3, $m$ represents 1, 2, 3 or 5, $n$ represents 3, 4 or 6, and $p$ represents 1, 2 or 3.

DETAILED DESCRIPTION OF THE INVENTION

The processing solution of this invention can be employed with a metal image-forming material comprising a support, a thin metallic layer comprising aluminum as a main component on the support, and a photosensitive resin layer on the thin metallic layer, particularly to the metal image-forming material disclosed in the above-cited Japanese patent application (OPI) No. 139720/75, now U.S. Pat. No. 4,008,084, the disclosure of which is herein incorporated by reference.

In the present invention, the term "developing solution" is used to describe a metal etching solution for the metal image-forming material. However, since in many cases the photosensitive resin layer of the metal image-forming material is also developable with the alkaline solution (that is, the exposed or unexposed portion of the photosensitive resin layer can be dissolved or swollen therewith), the developing solution in accordance with this invention also includes a solution which can develop both the photosensitive resin layer and the metallic layer.

Aqueous solutions of various alkaline materials can be used as the alkaline solution in accordance with this invention. Examples of suitable alkaline solutions are aqueous solutions of lithium hydroxide, sodium hydroxide, potassium hydroxide, rubidium hydroxide, cesium hydroxide, ammonium hydroxide, and magnesium hydroxide. Of these, aqueous solutions of sodium hydroxide and potassium hydroxide are especially preferred.

When the processing solution of this invention is used as a developer solution, a suitable degree of alkalinity may be chosen depending on the composition of the photosensitive resin layer from the standpoint of the rate of development and the shape of halftone dots to be formed. Usually, a suitable pH for the solution ranges from about 10 to about 14, preferably 11 to 13.5. On the other hand, when the processing solution of the invention is used as a reducer for halftone dots, the solution must penetrate between the resin layer and the support, and thus to etch the metal layer. Thus, the pH of the reducer solution should be adjusted to a pH of at least about 11, preferably at least 12.

Inorganic salts which are alkaline in aqueous solution such as sodium carbonate, sodium tertiary phosphate, sodium aluminate, potassium carbonate, potassium metaaluminate or potassium phosphate, may be added to this processing solution. The use of sodium tertiary phosphate is especially preferred when it is desired to etch a metal composed mainly of aluminum as in the present invention. Preferably, these inorganic salts are present in the solution in an amount of at least about 0.001 mol/liter but not higher than about 0.5 mol/liter.

The processing solution of this invention is obtained using (2) at least one of bromic acid, iodic acid, periodic acid, or salts of these acids expressed by the general formula (I) or (II) above in such an alkaline solution as described above.

Preferred examples of specific compounds within the general formula (I) or (II) are $HBrO_3$, $Zn(BrO_3)_2$, $Al(BrO_3)_3$, $KBrO_3$, $Ca(BrO_3)_2$, $AgBrO_3$, $Co(BrO_3)_2$, $Cu(BrO_3)_2$, $NaBrO_3$, $Mg(BrO_3)_2$, $LiBrO_3$, $HIO_3$, $Zn(IO_3)_2$, $Al(IO_3)_3$, $KIO_3$, $Ca(IO_3)_2$, $AgIO_3$, $Co(IO_3)_2$, $Fe(IO_3)_2$, $Fe(IO_3)_3$, $Cu(IO_3)_2$, $NaIO_3$, $Mg(IO_3)_2$, $LiIO_3$, $HIO_4$, $Zn_5(IO_6)_2$, $KIO_4$, $NaIO_4$, $LiIO_4$, and $LiIO_6$. Of these, $HBrO_3$, $KBrO_3$, $NaBrO_3$, $HIO_3$, $KIO_3$, $NaIO_3$, $HIO_4$, $KIO_4$, and $NaIO_4$ are particularly preferred. The compounds of the general formula (I) or (II) are employed in the alkaline solution in an amount sufficient to prevent the formation of bubbles at the time of etching, preferably in a concentration of at least about 0.005 mol/liter, especially preferably at least about 0.01 mol/liter, e.g., up to a saturated solution thereof.

In addition to the above compounds of the general formula (I) or (II), a salt of a metal having a valence of at least 4 with bromic acid, iodic acid or periodic acid may be employed in the processing solution of this invention.

An organic solvent capable of promoting the swelling of the photosensitive resin may be incorporated in the processing solution of this invention in order to facilitate a contacting of the solution with the metal to be etched at the time of development, or to make it easier for the processing solution (reducer solution) to penetrate between the photosensitive resin layer and the support at the time of halftone dot reduction (that is, to facilitate side etching). Suitable organic solvents are selected depending on the type of photosensitive resin employed. In particular, alcohols such as methyl alcohol, ethyl alcohol or benzyl alcohol, and monoethers formed between alcohols with 1 to 5 carbon atoms (e.g., methanol, ethanol, propanol, butanol, n-amyl alcohol or isoamyl alcohol) and alkylene glycols (e.g., ethylene glycol, trimethylene glycol, tetraethylene glycol or propylene glycol), such as hydroxyalkyl alkyl ethers (e.g., β-hydroxyethyl methyl ether, β-hydroxyethyl ethyl ether, β-hydroxyethyl propyl ether or β-hydroxyethyl butyl ether) are preferred because thy moderately penetrate into the resin without excessively swelling the resin, and no difficulty such as an etching of undesired portions occurs. The amount of the organic solvent is about 0.1 to about 15% by volume, preferably 0.5 to 5% by volume, based on the processing solution. If the amount is smaller than about 0.1 % by volume, the effects achieved are not sufficient, and if the amount is larger than about 15% by volume, etching proceeds to an excessive degree.

In order to promote etching to a moderate extent, the processing solution of this invention may contain various surface active agents. Examples of suitable surfactants are those described in Japanese patent application (OPI) No. 32928/75 (at page 2, left column line 1 to page 4, right top column, line 4) (corresponding to U.S. patent application Ser. No. 491,006, filed July 23, 1974, now abandoned in favor of a continuation-in-part application therof, U.S. patent application Ser. No. 693,670, filed June 7, 1976), and commercially available surfactants such as alkyl ethers of polyethylene glycol or alkylaryl ethers of polyethylene glycol. The surfactant may be employed in the processing solution of this invention in an amount of about $5 \times 10^{-4}$ to about 0.1 mol/liter, preferably about 0.001 to about 0.01 mol/liter.

The processing solution of this invention can be applied to the metal image-forming material in any desired method. For example, the metal image-forming material may be immersed in the processing solution (in this case, the solution is preferably agitated), or the processing solution may be sprayed onto the metal image-forming material. When the processing solution is used as a reducer solution, it may be squirted onto the part to be reduced. The temperature of the processing solution which can be used in the present invention ranges from about 5° to about 70° C, preferably from about 10° to about 60° C, and the processing time ranges from about 5 seconds to about 10 minutes, preferably from about 10 seconds to about 7 minutes.

When the metal image-forming material is processed with the processing solution of this invention, the formation of bubbles at the time of metal etching can be prevented, and therefore, good contact of the processing solution with the metal to be etched can always be maintained. No unevenness, therefore, occurs in etching, and the etching can be carried out rapidly. Furthermore, the similarity of the shapes of halftone dots before and after dot reduction is superior. The processing solution of this invention is very safe since it does not contain dangerous materials that are deterimental to storage and handling.

The following Examples are given to illustrate the present invention more specifically. Unless otherwise indicated herein, all parts, percentages, ratios and the like are by weight.

EXAMPLE 1

An Al/Fe (5:1 atomic ratio) alloy (about 400 mg) was placed in a tungsten boat disposed in a vacuum evaporation apparatus, and a 100 μm-thick polyethylene terephthalate film was placed within the vacuum evaporation apparatus at a point about 30 cm away from the above evaporation source. Under a vacuum of about $5 \times 10^{-5}$ torr, a vacuum evaporated coating of an aluminum iron alloy having a thickness of about 600 Å was obtained.

A photosensitive resin composition of the following formulation was coated on the vacuum evaporated alloy coating to a dry thickness of about 1.5 μm using a whirler, and dried in a dryer at 100° C for 2 minutes.

| Formulation of the Photosensitive Resin Composition | |
| --- | --- |
| Copolymer of Methyl Methacrylate/Methacrylic Acid (molar ratio of methyl methacrylate/methacrylic acid = 75:25) (having an η of 0.17 at 30° C in methyl ethyl ketone) | 1 g |
| Pentaerythritol Tetraacrylate | 0.85 g |
| N-Methyl-2-benzoyl-methylene-β-naphthothiazole | 0.06 g |
| Methyl Ethyl Ketone | 12 g |
| Methyl Cellosolve Acetate | 12 g |

The photographic material so obtained was exposed through a halftone original for 40 seconds at a distance of 1 m using a Fuji PS Light (a 2 kw metal halide lamp, produced by the Fuji Photo Film Co., Ltd.), and then immersed in a processing solution having the following formulation.

| Formulation of Processing Solution | |
| --- | --- |
| NaOH | 4 g |
| KBrO$_3$ | 10 g |
| Water | 1 l |

Formation of bubbles in the etching of the metal layer was completely inhibited, and the metal layer at the unexposed portion was almost completely removed affter an immersion time of about 18 seconds at a solution temperature of 26° C. On the other hand, measurement with a halftone dot planimeter (BeUVAC 75, a product of Toyo Ink/Nireco) confirmed that at the exposed area of the metal layer, dark and bright areas were almost completely reversed from the halftone original.

When the exposed material was processed with a developer solution containing only 4 g of NaOH and 1 liter of water, bubbles were formed, and the metal remained in the form of dots at the unexposed portion.

EXAMPLE 2

A photosensitive material prepared and exposed in the same was as in Example 1 was immersed in a processing solution having the following formulation.

| Formulation of Processing Solution | |
| --- | --- |
| NaOH | 4 g |
| NaIO$_3$ | 10 g |
| Water | 1 l |

At this time, the formation of bubbles due to the etching of the metal layer was completely inhibited, and the metal layer at the unexposed portion was substantially completely removed aften an immersion time of about 20 seconds at a solution temperature of 26° C. On the other hand, at the exposed portion of the metal layer, bright and dark areas were substantially completely reversed from the halftone original.

EXAMPLE 3

A photosensitive material prepared and exposed in the same way as in Example 1 was immersed in a processing solution of the following formulation.

| Formulation of Processing Solution | |
| --- | --- |
| NaOH | 3 g |
| NaBrO$_3$ | 10 g |
| Benzyl Alcohol | 20 ml |
| Water | 1 l |

At this time, the formation of bubbles due to the etching of the metal layer was completely inhibited. Furthermore, since the resin at the unexposed portion was swollen by the benzyl alchol, the rate of penetration of the alkaline solution was high. After an immersion time of about 12 seconds at a solution temperature of 26° C, the metal layer at the unexposed portion was completely removed. It was confirmed on the other hand that in the metal layer at the exposed portion, the bright and dark areas were substantially completely reversed from the original.

EXAMPLE 4

Each of the photosenstive materials obtained in Examples 1 to 3 after development was immersed in a soluton of the following formulation.

| Formulation of Processing Solution | |
| --- | --- |
| NaOH | 2 g |
| KBrO$_3$ | 6 g |
| Water | 100 ml |

After immersion for 1 minute at a solution temperature of 20° C, the size of the halftone dots were reduced by about 10% that of the previous size of the halftone dots, and the similarity of the halftone dots after reduction to that before was superior.

On the other hand, when the halftone dots were reduced by using a reducer solution of 2 g of sodium hydroxide and 100 ml of water, the shape of the halftone dots after reduction was poor, and the reduction was seen to be retarded partly within each of the halftone dots.

EXAMPLE 5

On an aluminum/iron vacuum evaporated film prepared in the same way as in Example 1, AZ-1350 (trademark for a product of the Shipley Company, a photosensitive resin, whose alkali insolubility is changed into alkali solubility due to ultraviolet light exposure) was coated thereon in a dry thickness of about 1.5 μm using a whirler, and dried in a dryer at 100° C for 2 minutes.

The photosensitive material so obtained was exposed in an image through a halftone original for 60 seconds at a distance of 1 m using a Fuji PS Light, and then immersed in a processing solution having the following formulation.

| Formulation of Processing Solution | |
| --- | --- |
| NaOH | 3 g |
| KBrO$_3$ | 10 g |
| Water | 1 l |

At this time, formation of bubbles due to the etching of the metal layer was completely inhibited, and after an immersion time of 20 seconds at a solution temperature of 26° C the metal layer at the exposed portion was completely removed, and substantially the same halftone image as the original was obtained.

EXAMPLE 6

A photosensitive material prepared in the same way as in Example 1 was immersed in a processing solution having the following formulation.

| Formulation of Processing Solution | |
|---|---|
| NaOH | 3 g |
| NaBrO₃ | 10 g |
| Polyethylene glycol dodecyl ether (30% aq. soln.) (surfactant) | 20 ml |
| Water | 1 l |

At this time, the formation of bubbles due to etching of the metal layer was completely inhibited. Due to the action of the surfactant, the rate of penetration of the alkaline solution at the unexposed portion increased, and after an immersion time of about 15 seconds at a solution temperature of 26° C, the metal layer at the unexposed portion was completely removed. On the other hand, it was confirmed that at the exposed portion of the metal layer, the bright and dark areas were substantially completely reversed from the original.

EXAMPLE 7

A solution of the following formulation was coated on the photosensitive material obtained in Example 6 after development using a brush.

| Formulation of Processing Solution | |
|---|---|
| NaOH | 2 g |
| KBrO₃ | 6 g |
| Surfactant (same as used in Example 6) | 2 ml |
| Water | 100 ml |

After standing for 1 minute at a solution temperature of 20° C, the halftone dots were reduced by about 10% that of the previous size of the halftone dots, and the similarity of the halftone dots after reduction to that before was superior.

While the invention has been described in detail and with reference to specific embodiments thereof, it will be apparent to one skilled in the art that various changes and modifications can be made therein without departing from the spirit and scope thereof.

What is claimed is:

1. A processing solution useful for the development of or halftone dot reduction of a metal image-forming material comprising a support, a thin metallic layer composed mainly of aluminum on the support, and a photosensitive resin layer on the metallic layer, said processing solution comprising (1) an alkaline solution, and (2) at least one compound of the formula (I) or (II):

$$M(BrO_3)_p \quad (I)$$

$$M_m(IO_n)_p \quad (II)$$

wherein M represents a hydrogen atom or a metal having a valence of 1 to 3, $m$ represents 1, 2, 3 or 5, $n$ represents 3, or 6, and $p$ represents 1, 2 or 3.

2. The processing solution of claim 1, wherein the processing solution is used for development and the pH of the processing solution is about 10 to about 14.

3. The processing solution of claim 1, wherein the processing solution is used for halftone dot reduction and the pH of the processing solution is at least about 11.

4. The processing solution of claim 1, wherein the alkaline soluton is an aqueous solution of sodium hydroxide or potassium hydroxide.

5. The processing solution of claim 1, further containing an alkaline inorganic salt in an amount of at least about 0.001 mol/liter.

6. The processing solution of claim 5, wherein the inorganic salt is sodium tertiary phosphate.

7. The processing solution of claim 5, wherein the inorganic salt is sodium aluminate.

8. The processing solution of claim 1, wherein the amount of the compound of the general formula (I) or (II) is at least about 0.005 mol/liter.

9. The processing solution of claim 8, wherein the amount of the compound of the general formula (I) or (II) is at least about 0.01 mol/liter.

10. The processing solution of claim 1, wherein the compound of the general formula (I) or (II) is HBrO₃, KBrO₃, NaBrO₃, KIO₃, or NaIO₃.

11. The processing solution of claim 1, further containing about 0.1 to about 15% by volume of an organic solvent capable of swelling the photosensitive resin.

12. The processing solution of claim 10, wherein the organic solvent is an alcohol, or a monether of an alcohol having 1 to 5 carbon atoms with an alkylene glycol.

13. The processing solution of claim 1, further containing about $5 \times 10^{-4}$ to about 0.1 mol/liter of a surface active agent.

14. A processing solution consisting essentially of an alkaline solution and at least one compound of the formula (I) or (II):

$$M(BrO_3)_p \quad (I)$$

$$M_m(IO_n)_p \quad (II)$$

where M represents a hydrogen atom or a metal having a valence of 1 to 3, $m$ represents 1, 2, 3 or 5, $n$ repesents 3 or 6, and $p$ represents 1, 2 or 3 and having a pH of 10 to 14.

15. The processing solution of claim 14 wherein the solution consists of said alkaline solution, said compounds and has a pH of 10 to 14.

16. The processing solution of claim 15 further containing either or both an organic solvent and a surfactant.

17. A process for forming a metallic image comprising imagewise exposing a metal image-forming material comprising a support, a thin metallic layer composed mainly of aluminum on the support, and a photosensitive resin layer on the metallic layer; immersing said exposed metallic image forming material in a processing solution comprising (1) an alkaline solution, (2) at least one compound of the formula (I) or (II):

$$M(BrO_3)_p \quad (I)$$

$$M_m(IO_n)_p \quad (II)$$

wherein M repesents a hydrogen atom or a metal having a valence of 1 to 3, $m$ repesents 1, 2, 3 or 5, $n$ represents 3 or 6 and $p$ represents 1, 2 or 3.

18. The process of claim 17 wherein said processing solution consists essentially of said alkaline solution and said compound of the formula (I) or (II).

19. The process of claim 17 wherein said processing solution consists of said alkaline solution and said compound of the formula (I) or (II).

20. The process of claim 19 wherein said processing solution further contains either or both an organic solvent and a surfactant.

21. The process of claim 17 wherein the pH of said processing solution is about 10 to about 14.

22. The process of claim 17 wherein said immersing is conducted to dissolve or swell the photosensitive resin layer and dissolve the underlying layer of aluminum to form a metallic image and the pH of said solution is about 10 to about 14.

23. The process of claim 22 wherein subsequent to said development, said developed metal image forming material is immersed in said processing solution having a pH of at least 11 in order to perform halftone dot reduction.

* * * * *